US012813040B2

(12) United States Patent
Hsieh et al.

(10) Patent No.: US 12,813,040 B2
(45) Date of Patent: Nov. 24, 2026

(54) LIGHT-EMITTING DEVICE AND MANUFACTURING METHOD THEREOF

(71) Applicant: LITE-ON TECHNOLOGY CORPORATION, Taipei City (TW)

(72) Inventors: Cheng-Yan Hsieh, Taipei City (TW); Jie-Ting Tsai, New Taipei City (TW); Kuo-Ming Chiu, New Taipei City (TW)

(73) Assignee: LITE-ON TECHNOLOGY CORPORATION, Taipei City (TW)

( * ) Notice: Subject to any disclaimer, the term of this patent is extended or adjusted under 35 U.S.C. 154(b) by 365 days.

(21) Appl. No.: 18/632,444

(22) Filed: Apr. 11, 2024

(65) Prior Publication Data

US 2024/0421273 A1 Dec. 19, 2024

Related U.S. Application Data

(60) Provisional application No. 63/472,621, filed on Jun. 13, 2023.

(30) Foreign Application Priority Data

Feb. 6, 2024 (CN) ......................... 202410166417.9

(51) Int. Cl.
*H10H 20/856* (2025.01)
*H10H 20/84* (2025.01)
(Continued)

(52) U.S. Cl.
CPC .......... *H10H 20/856* (2025.01); *H10H 20/84* (2025.01); *H10H 20/8514* (2025.01);
(Continued)

(58) Field of Classification Search
CPC .. H10H 20/856; H10H 20/84; H10H 20/8514; H10H 20/852; H10H 20/857;
(Continued)

(56) References Cited

U.S. PATENT DOCUMENTS 10,522,728 B2 * 12/2019 Chen ...................... H10H 20/01
10,777,713 B2 * 9/2020 Tangring ............ H10H 20/8514
(Continued)

FOREIGN PATENT DOCUMENTS

CN 105874615 A 8/2016
CN 106410012 A 2/2017
(Continued)

*Primary Examiner* — Mark W Tornow
(74) *Attorney, Agent, or Firm* — Li & Cai Intellectual Property (USA) Office

(57) ABSTRACT

A light-emitting device and a manufacturing method thereof are provided. The light-emitting device includes a light-emitting chip, a first reflective layer, a light-permeable layer, an adhesive material, and a second reflective layer. The light-emitting chip has a light-emitting surface. The first reflective layer surrounds a first side surface of the light-emitting chip. The light-permeable layer is disposed on the light-emitting surface of the light-emitting chip and has a light-exiting surface and a second side surface. The adhesive material has a central portion and an extension portion. The central portion corresponds to the light-emitting surface. The extension portion is connected to the central portion and is located on a first upper surface of the first reflective layer. The second reflective layer is disposed on the first reflective layer to surround the second side surface of the light-permeable layer and cover the extension portion.

9 Claims, 11 Drawing Sheets

(51) Int. Cl.
*H10H 20/851* (2025.01)
*H10H 20/852* (2025.01)
*H10H 20/857* (2025.01)
*H10W 90/00* (2026.01)

(52) U.S. Cl.
CPC ........ *H10H 20/852* (2025.01); *H10H 20/857* (2025.01); *H10W 90/00* (2026.01)

(58) Field of Classification Search
CPC ... H10H 20/841; H10H 20/034; H10W 90/00; H10K 59/38; H10K 59/122; H10K 59/126
See application file for complete search history.

(56) References Cited

U.S. PATENT DOCUMENTS

| | | | | |
|---|---|---|---|---|
| 2020/0259054 | A1* | 8/2020 | Hsieh | H10H 20/8506 |
| 2022/0246805 | A1* | 8/2022 | Lee | H10H 20/01 |
| 2023/0120890 | A1* | 4/2023 | Kamp | G02B 1/002<br>349/194 |
| 2024/0154076 | A1* | 5/2024 | Pertuit | H10H 20/8513 |

FOREIGN PATENT DOCUMENTS

| | | | |
|---|---|---|---|
| CN | 110890453 | A | 3/2020 |
| CN | 111525007 | A | 8/2020 |
| TW | 201724575 | A | 7/2017 |
| TW | 201830732 | A | 8/2018 |

* cited by examiner

LIGHT-EMITTING DEVICE AND MANUFACTURING METHOD THEREOF

CROSS-REFERENCE TO RELATED PATENT APPLICATION

This application claims the benefit of priorities to the U.S. Provisional Patent Application Ser. No. 63/472,621, filed on Jun. 13, 2023, and to the China Patent Application No. 202410166417.9, filed on Feb. 6, 2024, the contents of which are incorporated herein by reference in their entireties Some references, which may include patents, patent applications and various publications, may be cited and discussed in the description of this disclosure. The citation and/or discussion of such references is provided merely to clarify the description of the present disclosure and is not an admission that any such reference is “prior art” to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting device, and more particularly to an optoelectronic semiconductor device.

BACKGROUND OF THE DISCLOSURE

Optoelectronic semiconductor devices are commonly used in daily lives of people. With the development of science and technology, optoelectronic semiconductors have wider application fields and play an important role in fields such as automotive lighting, micro projectors, optical lighting, and display.

For the art field mentioned above, the light conversion efficiency of optoelectronic semiconductor is particularly important.

Referring to FIG. 1, FIG. 1 is a cross-sectional view of an optoelectronic semiconductor device 4 in the prior art. The optoelectronic semiconductor device 4 includes a circuit substrate 41, a light-emitting chip 42, and a light-permeable layer 43. An adhesive layer 44 is disposed between the light-emitting chip 42 and the light-permeable layer 43. The light-emitting chip 42 and the light-permeable layer 43 are surrounded by a reflective layer 45. In this prior art, the resin of the reflective layer 45 easily penetrates between the light-emitting chip 42 and the light-permeable layer 43 during a forming process (i.e., a molding process) to shield the light emitted by the light-emitting chip 42, such that the light emitting efficiency is reduced.

Therefore, how to design a structure of an optoelectronic semiconductor device to solve the above technical problems, has become a great subject to be addressed by those skilled in the art.

SUMMARY OF THE DISCLOSURE

In response to the above-referenced technical inadequacies, the present disclosure provides a light-emitting device.

In order to solve the above-mentioned problems, one of the technical aspects adopted by the present disclosure is to provide a light-emitting device. The light-emitting device includes a light-emitting chip, a first reflective layer, a light-permeable layer, an adhesive element, and a second reflective layer. The light-emitting chip has a light-emitting surface. The first reflective layer surrounds a first side surface of the light-emitting chip. The light-permeable layer is disposed on the light-emitting surface of the light-emitting chip, and the light-permeable layer has a light-exiting surface and a second side surface. The adhesive element disposed between the light-emitting chip and the light-permeable layer. The adhesive element has a central portion and at least one extension portion, and the central portion corresponds to the light-emitting surface. The at least one extension portion is connected to the central portion and located on a first upper surface of the first reflective layer, and the at least one extension portion extends to a part of the second side surface. The second reflective layer disposed on the first reflective layer. The second reflective layer surrounds the second side surface and covers the at least one extension portion, the light-exiting surface is exposed on a second upper surface of the second reflective layer, and the light-emitting surface is flush with the second upper surface.

In one of the possible or preferred embodiments, the light-emitting device further includes a circuit board. The light-emitting chip is disposed on the circuit board and is in electrical connection with the circuit board.

In one of the possible or preferred embodiments, the light-permeable layer has a wavelength converting substance.

In one of the possible or preferred embodiments, an adhering surface is defined on a surface of the light-permeable layer facing the light-emitting surface. An area of the adhering surface is greater than, equal to, or smaller than an area of the light-emitting surface.

In one of the possible or preferred embodiments, when a cross-section of the light-emitting device is viewed from a lateral side of the light-emitting device, the extension portion is triangular-shaped.

In one of the possible or preferred embodiments, a quantity of the extension portions is four.

In one of the possible or preferred embodiments, a range of a thickness of the light-permeable layer is from 100 μm to 300 μm.

In one of the possible or preferred embodiments, a range of a refractive index of the light-permeable layer is from 1.0 to 2.0.

In one of the possible or preferred embodiments, the light-emitting device further includes a protective film covering the first reflective layer, the second reflective layer, and the light-permeable layer.

In one of the possible or preferred embodiments, a range of a thickness of the protective film is from 10 μm to 100 μm.

In order to solve the above-mentioned problems, another one of the technical aspects adopted by the present disclosure is to provide a manufacturing method of a light-emitting device. The manufacturing method includes the following steps of: providing a light-emitting chip having a light-emitting surface; disposing a first reflective layer surrounding a first side surface of the light-emitting chip; disposing an adhesive material on the light-emitting surface of the light-emitting chip; disposing a light-permeable layer on the adhesive material, and supplying a pressure to the light-permeable layer such that the adhesive material expands along at least one direction to form an adhesive element; the adhesive element having a central portion and an extension portion; the central portion corresponding to the light-emitting surface and being located on the light-emitting surface; the extension portion being in connection with the central portion and being located on a first upper surface of the first reflective layer and extending to a part of a second side surface of the light-permeable layer; and disposing a second reflective layer on the first reflective layer; the second reflective layer surrounding the second side surface and covering the extension portion; a light-exiting surface of the light-permeable layer being exposed on a second upper surface of the second reflective layer.

In one of the possible or preferred embodiments, the manufacturing method further includes: disposing a circuit board. The light-emitting chip and the first reflective layer are located on the circuit board.

Therefore, in the light-emitting device provided by the present disclosure, by virtue of "the first reflective layer surrounding a first side surface of the light-emitting chip," "the adhesive element being disposed between the light-emitting chip and the light-permeable layer; the adhesive element having a central portion and at least one extension portion, and the central portion corresponding to the light-emitting surface; the extension portion being in connection with the central portion and being located on a first upper surface of the first reflective layer, and the extension portion extending to a part of the second side surface," and "the second reflective layer being disposed on the first reflective layer, the second reflective layer surrounding the second side surface and covering the extension portion, the light-exiting surface being exposed on a second upper surface of the second reflective layer, and the light-exiting surface being flush with the second upper surface," the structure of the light-emitting device can improve the luminous effect and enhance the photoelectric conversion efficiency of the light-emitting device.

The present disclosure further provides a manufacturing method of a light-emitting device, and the manufacturing method can also produce the light-emitting device having the abovementioned advantages.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
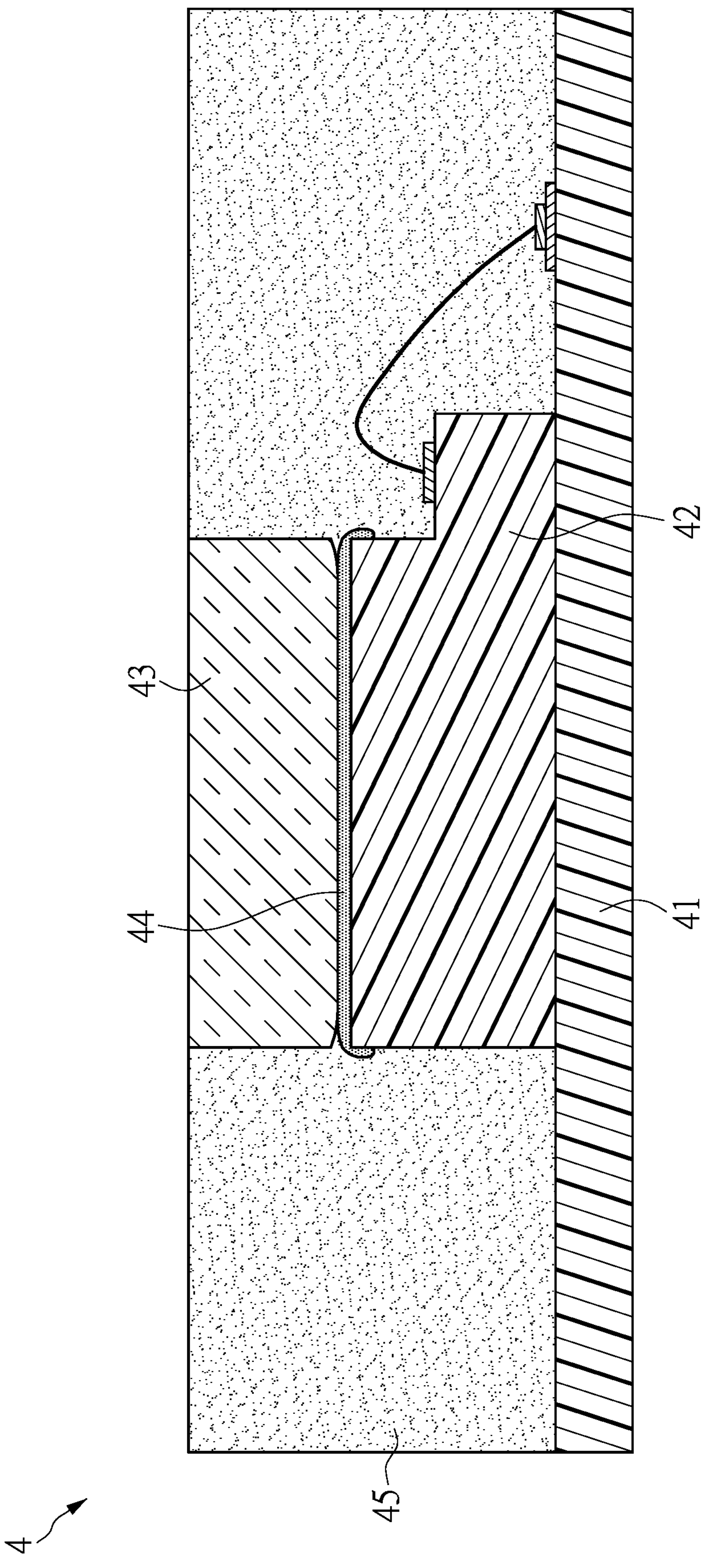
FIG. 1(Related Art)
FIG. 1 is a schematic cross-sectional view of an optoelectronic semiconductor device according to the prior art.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 2:
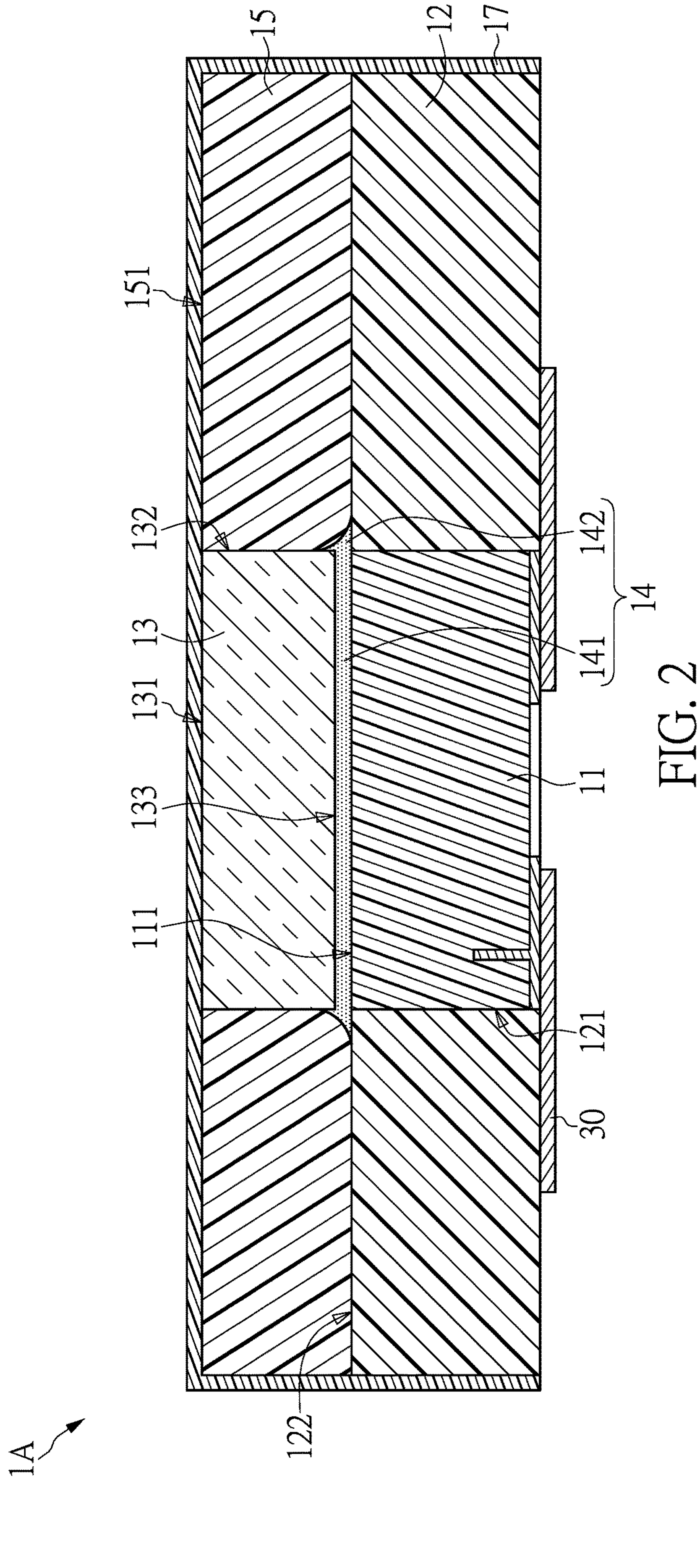
FIG. 2 is a schematic cross-sectional view of a light-emitting device according to one embodiment of the present disclosure.
Figure 3:
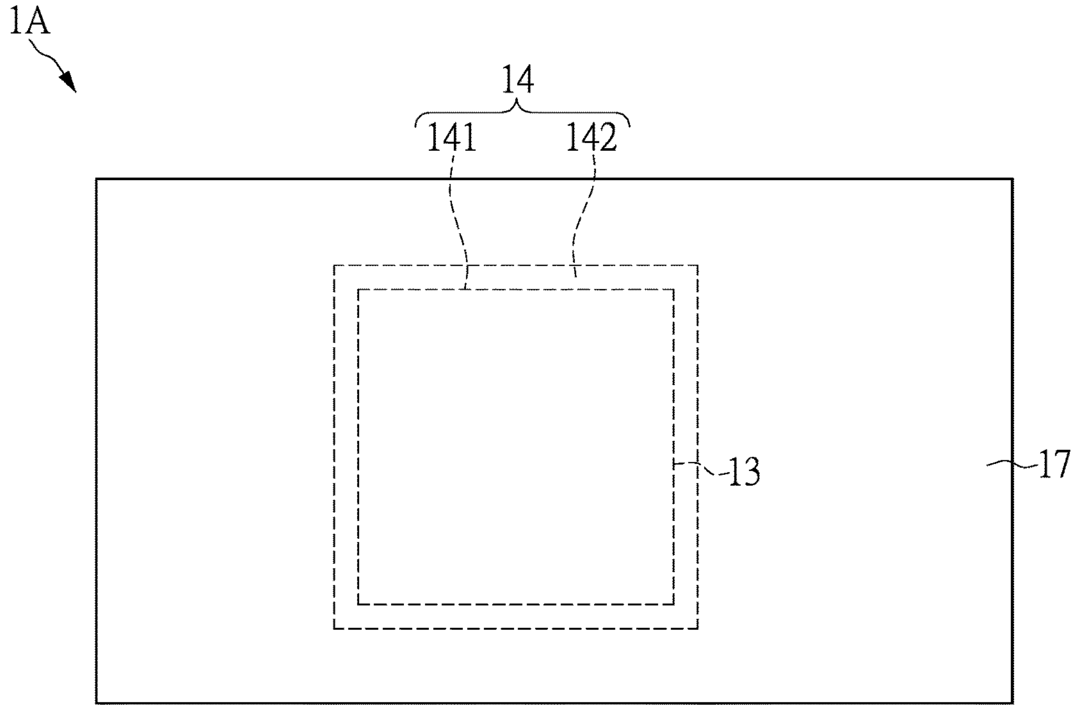
FIG. 3 is a top view of the embodiment of FIG. 2, only showing a light-permeable layer 13, an adhesive element 14, and a protective film 17.

Referring to FIGS. 2 and 3, FIG. 2 is a schematic cross-sectional view of a light-emitting device according to one embodiment of the present disclosure, and FIG. 3 is a top view of the embodiment of FIG. 2, only showing a light-permeable layer 13, an adhesive element 14, and a protective film 17. A light-emitting device 1A includes a light-emitting chip 11, a first reflective layer 12, a light-permeable layer 13, an adhesive element 14, and a second reflective layer 15. The light-emitting chip 11 has a light-emitting surface 111. The first reflective layer 12 surrounds a first side surface 121 of the light-emitting chip 11. The light-permeable layer 13 is disposed on the light-emitting surface 111 of the light-emitting chip 11 and having a light-exiting surface 131 and a second side surface 132. The adhesive element 14 is disposed between the light-emitting chip 11 and the light-permeable layer 13. The adhesive element 14 has a central portion 141 and an extension portion 142. The central portion 141 corresponds to the light-emitting surface 111, and the extension portion 142 is connected to the central portion 141 and located on a first upper surface 122 of the first reflective layer 12, and extends to a part of a second side surface 132 of the light-permeable layer 13. The second reflective layer 15 is disposed on the first reflective layer 12, and the second reflective layer 15 surrounds the second side surface 132 of the light-permeable layer 13 and covers the extension portion 142. The light-exiting surface 131 is exposed on a second upper surface 151 of the second reflective layer 15. Preferably, the light-exiting surface 131 is flush with the second upper surface 151 of the second reflective layer 15. In other words, the present disclosure has the technical features of firstly forming the first reflective layer 12 and the extension portion 142 being extended to a part of the second side surface 134 of the light-permeable layer 13, thereby preventing the resin of the second reflective layer 15 from penetrating into the gap between the light-emitting chip 11 and the light-permeable layer 13 when the second reflective layer 15 is molded, so as to improve the light-emitting effect.

The light-emitting chip 11 can be a vertical light-emitting diode or a flip-chip light-emitting diode (such as the embodiment shown in FIG. 2).

The light-permeable layer 13 of the present disclosure can be made of any material commonly used in the industry, such as resin, glass, or ceramics. According to certain embodiments, the light-permeable layer 13 is a hydroxyl acrylic resin. According to other embodiments, the light-permeable layer 13 is a silicone-based resin, an epoxy resin, or a polyimide resin. In some embodiments, the light-permeable layer 13 has a wavelength converting substance, such as fluorescent powder or phosphor powder. For example, the light-permeable layer 13 is a glass sheet having phosphor powders added therein (phosphor in glass, PIG). In some embodiments, a range of a refractive index of the light-permeable layer 13 is from 1.0 to 2.0. In the embodiment shown in FIG. 2, a surface of the light-permeable layer 13 facing the light-emitting surface 111 is defined as an adhering surface 133. An area of the adhering surface 133 is equal to an area of the light-emitting surface 111. However, the present disclosure is not limited thereto. In some embodiments, the area of the adhering surface 133 may be larger or smaller than the area of the light-emitting surface 111. In some embodiments, a range of a thickness of the light-permeable layer 13 is from 100 μm to 300 μm. In addition, in some embodiments, the light-permeable layer 13 contains light diffusion particles to improve a light uniformity.

The light-permeable layer 13 is attached to the light-emitting chip 11 through the adhesion of the adhesive element 14. As shown in FIG. 2, the adhesive element 14 includes the central portion 141 and at least one extension portion 142. The central portion 141 is located between the light-emitting surface 111 and the light-permeable layer 13. The extension portion 142 extends to the first upper surface 122 of the first reflective layer 12 and extends to a part of the second side surface 132 of the light-permeable layer 13. In other words, the extension portion 142 is not located on the light-emitting surface 111, and the extension portion 142 is not present between the light-emitting chip 11 and the first reflective layer 12. According to certain embodiments, the adhesive element 14 is also light-permeable and can be made of an organic material, such as polydimethylsiloxane (PDMS). In addition, as shown in FIGS. 3 to 6, the extension portions 142 may be plural in quantity. For example, when the light-emitting chip 11 and the light-permeable layer 13 are quadrangular-shaped, the central portion 141 also has four boundaries. As shown in FIG. 3, each of the boundaries is connected to an extension portion 142, such that a quantity of the extension portions 142 is four. In addition, in the embodiment shown in FIG. 2, when the cross-section of the light-emitting device 1A is viewed from a lateral side of the light-emitting device 1A, the extension portion 142 is in a shape of a triangle having an arced edge. However, the present disclosure is not limited thereto, and the cross-section of the extension portion 142 may also be in other geometric shapes, such as an arc shape.

In the present disclosure, persons skilled in the art may adjust the quantities and positions of the extension portions according to practical requirements. By referring to the infiltration status of the reflective glue during the original manufacturing process, an extension portion can be provided only on the edge of the infiltrating reflective glue.

Figure 4:
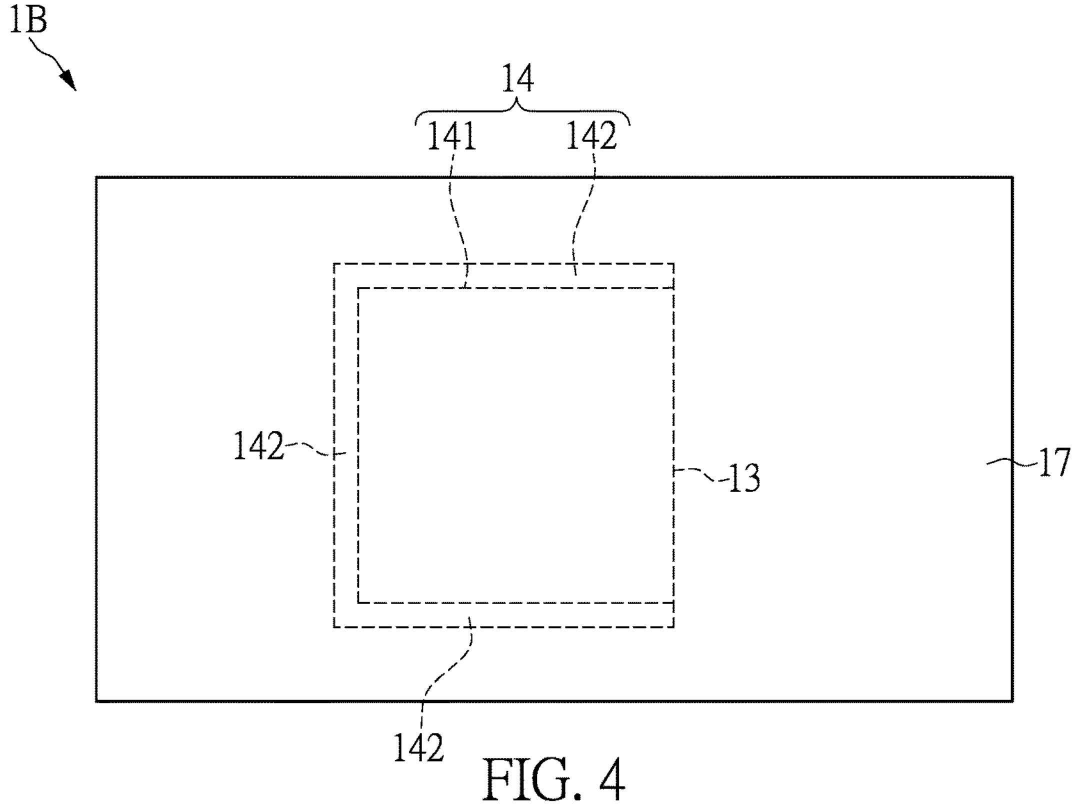
FIG. 4 to FIG. 6 are respectively top views of a light-emitting device according to one embodiment of the present disclosure, only showing the light-permeable layer 13, the adhesive element 14, and the protective film 17.
Figure 5:
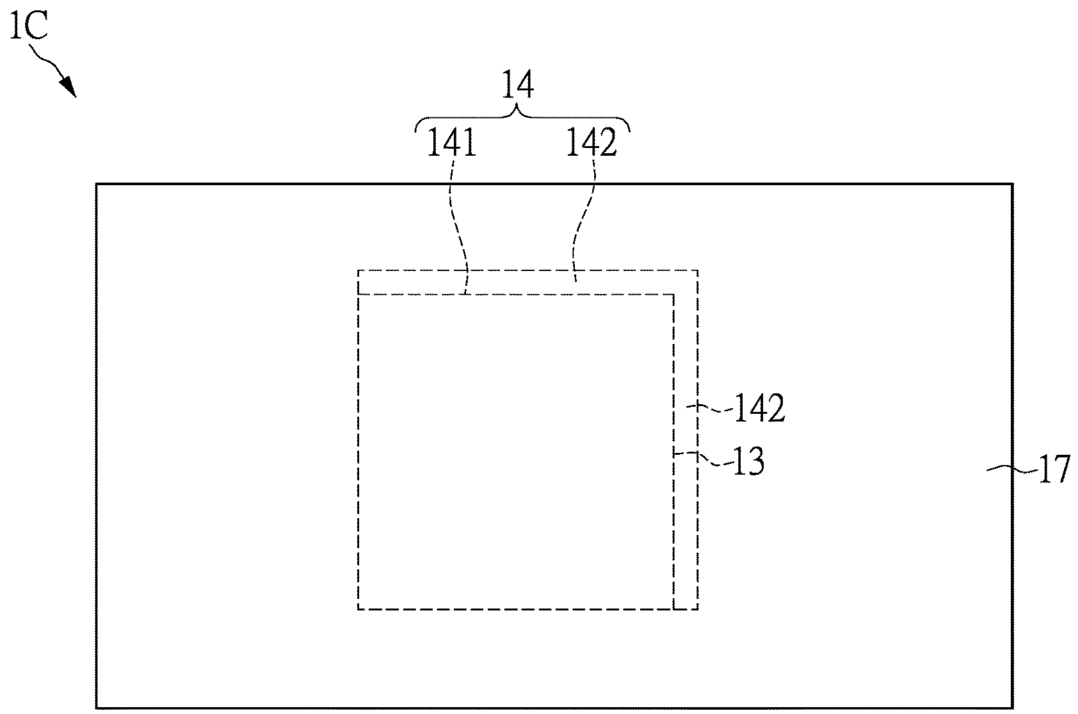
Figure 6:
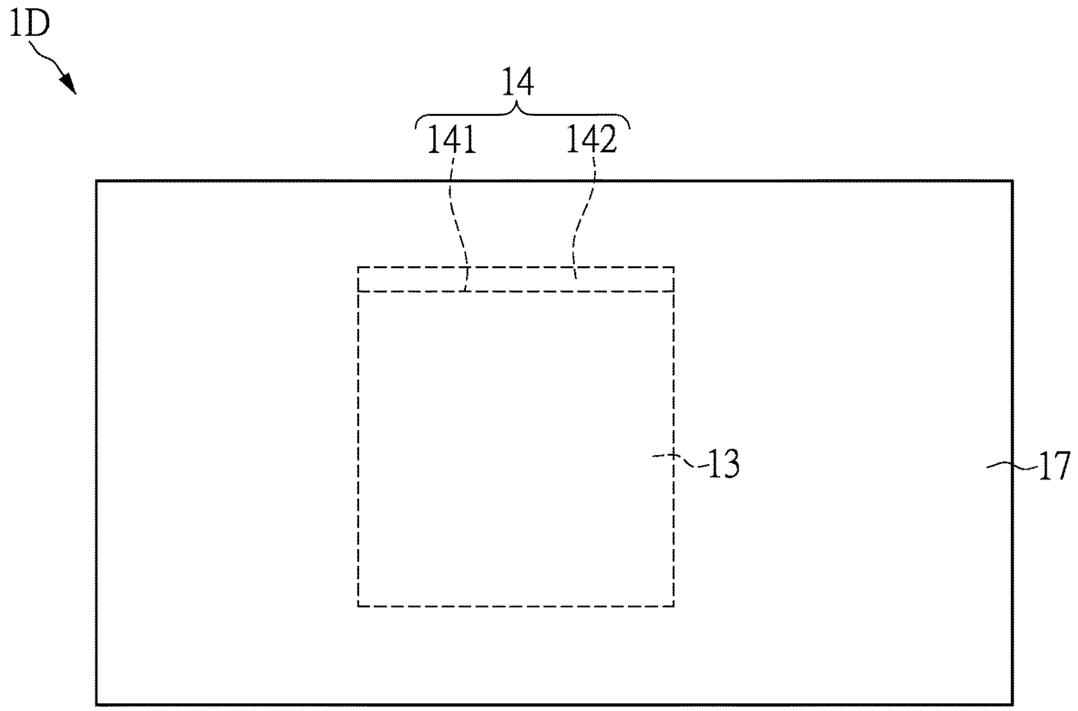

Referring to FIG. 4 to FIG. 6, FIG. 4 to FIG. 6 are respectively top views of light-emitting devices according to embodiments of the present disclosure, only showing the light-permeable layer 13, the adhesive element 14, and the protective film 17. The quantities of the extension portion 142 in these embodiments are respectively different from the embodiment shown in FIG. 3. In the embodiment shown in FIG. 4, the quantity of the extension portions 142 is three. In the embodiment shown in FIG. 5, the quantity of the extension portions 142 is two (the two extension portions may be adjacent to each other, or located on two opposite sides). In the embodiment shown in FIG. 6, one extension portion 142 is provided.

Reference is further made to FIG. 2. In this embodiment, the light-emitting device 1A may further include a protective film 17 that covers the first reflective layer 12, the second reflective layer 15, and the light-permeable layer 13. A range of a thickness of the protective film 17 is from 10 to 100 μm. The protective film 17 is light-permeable and protects the first reflective layer 12, the second reflective layer 15, and the light-permeable layer 13 (including the light-emitting chip 11) from moisture or corrosive substances (such as sulfur). The protective film 17 may exemplarily be made of a fluorine resin.

Figure 7:
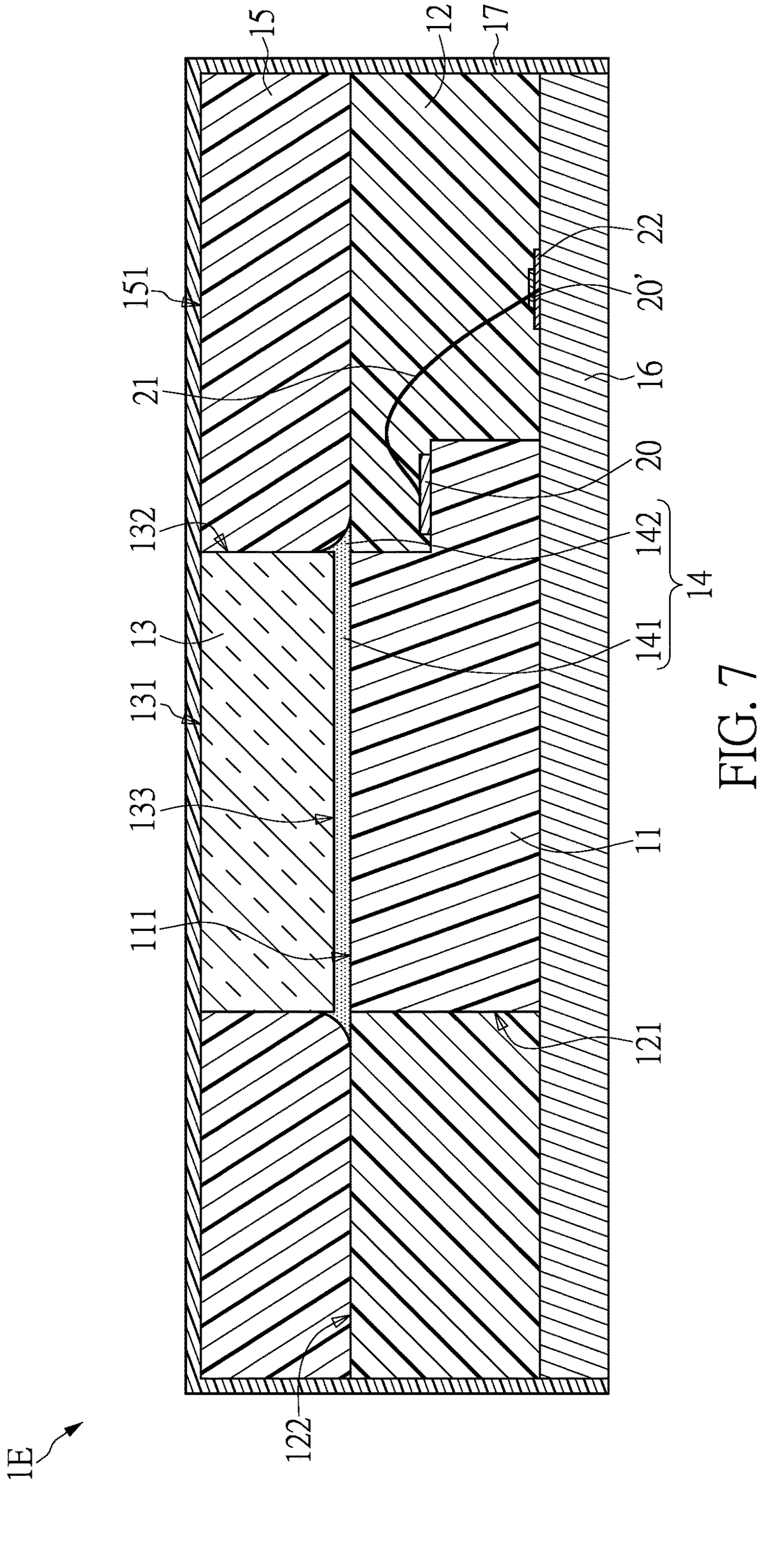
FIG. 7 is a schematic cross-sectional view of a light-emitting device according to one embodiment of the present disclosure.

Reference is made to FIG. 7, and FIG. 7 is a schematic cross-sectional view of a light-emitting device 1E according to one embodiment of the present disclosure. The difference between the embodiments shown in FIG. 1 and FIG. 7 is that, the light-emitting chip 11 in the light-emitting device 1E is exemplified as a vertical light-emitting diode and further includes a circuit board 16 in FIG. 7. The light-emitting chip 11 is disposed on the circuit board 16 and is in electrical connection with the circuit board 16 (through an electrode layer 22, a solder pad 20', a solder wire 21, and a solder pad 20 located on an upper surface of the light-emitting chip 11). Normally, the bottom of the vertical light-emitting diode has a bottom electrode, and the bottom electrode is in electrical connection with the circuit pattern of the circuit board 16 through conductive glue, which is not shown herein.

Figure 8:
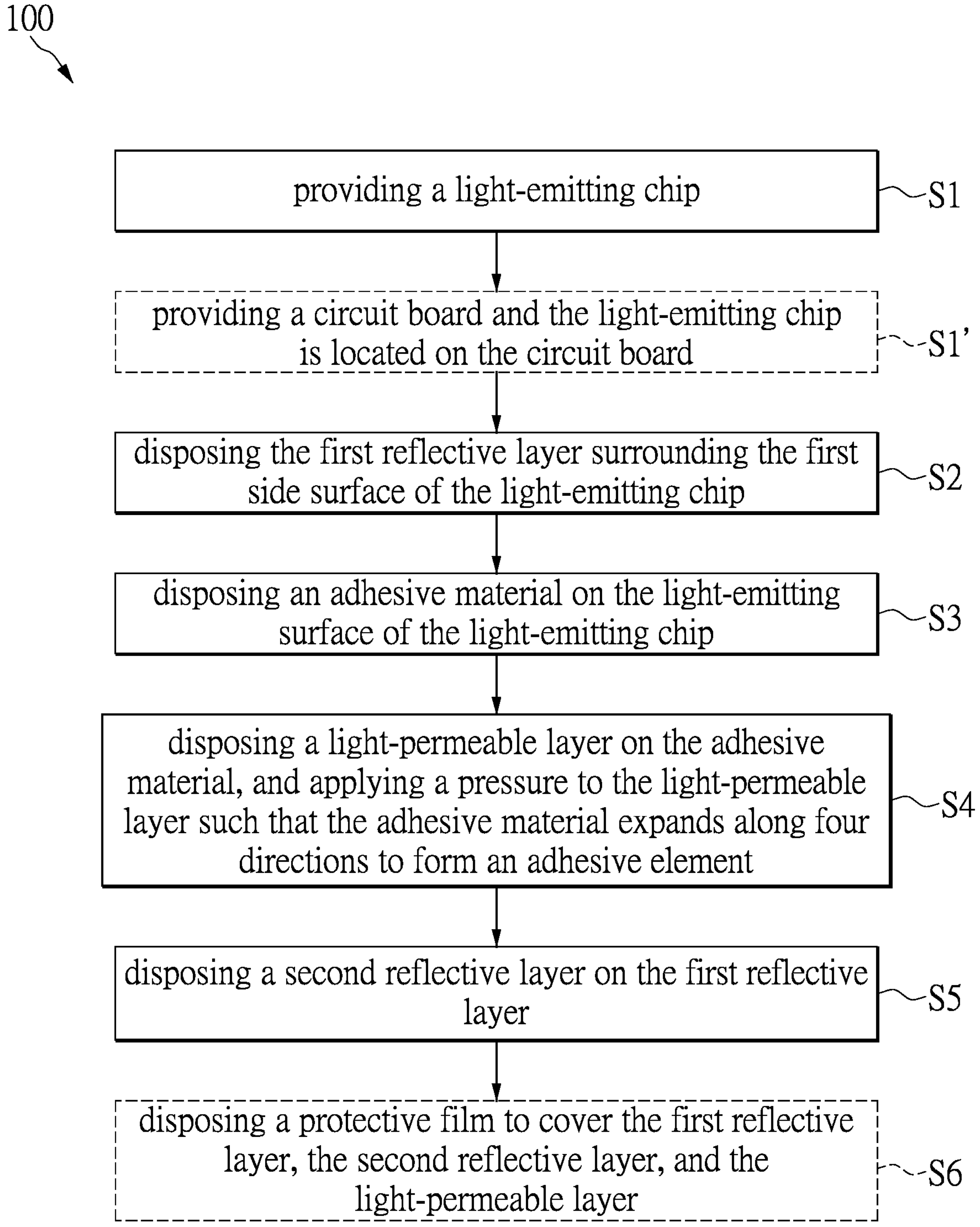
FIG. 8 is a schematic flowchart of a manufacturing method of a light-emitting device according to one embodiment of the present disclosure.

Reference is made to FIGS. 8 to 13, which is viewed in conjunction with FIG. 7. FIG. 8 is a schematic flowchart of a manufacturing method of a light-emitting device according to one embodiment of the present disclosure. FIGS. 9 to 13 are respectively schematic views of steps corresponding to the embodiment shown in FIG. 8. The manufacturing method 100 of a light-emitting device at least includes step S1 to step S5.

Figure 9:
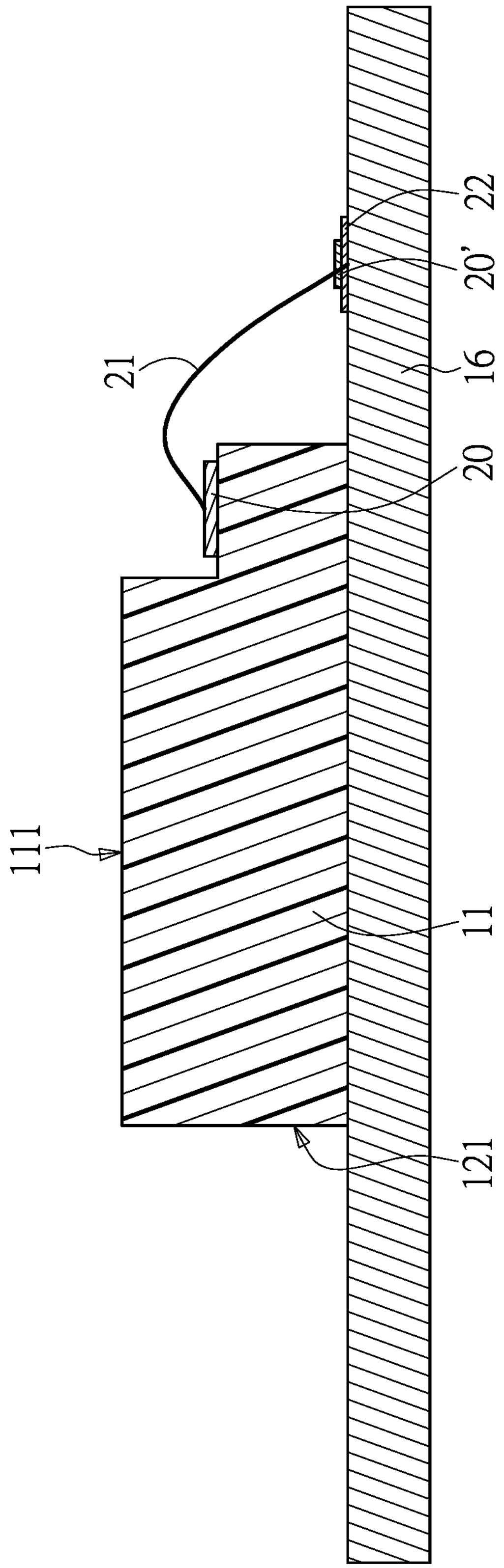
FIG. 9 to FIG. 13 are respectively schematic views of steps corresponding to the embodiment shown in FIG. 8.

Step S1 includes: providing a light-emitting chip 11; the light-emitting chip 11 having a light-emitting surface 111, as shown in FIG. 9.

Figure 10:
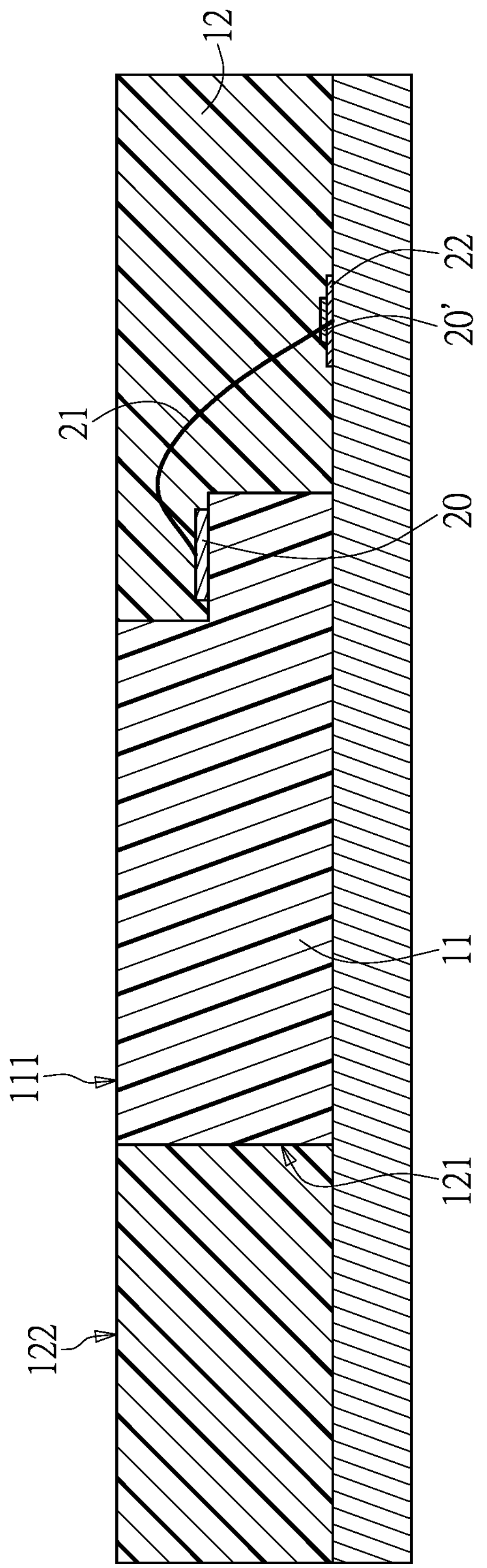

Step S2 includes: disposing the first reflective layer 12 surrounding the first side surface 121 of the light-emitting chip 11, as shown in FIG. 10.

Figure 11:
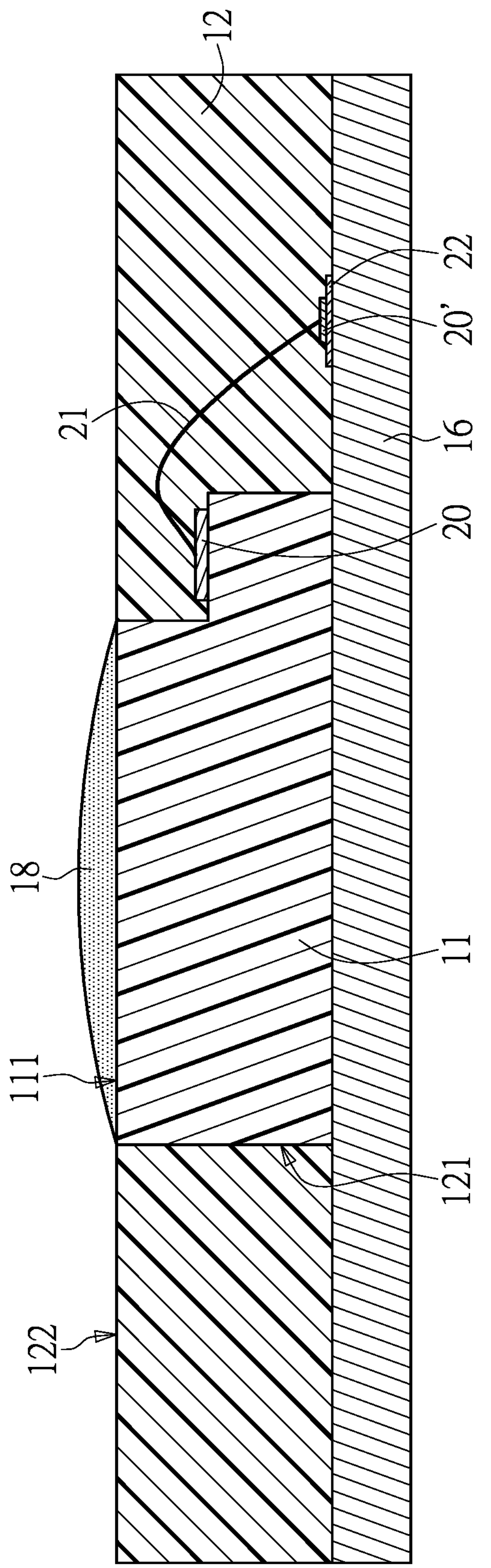

Step S3 includes: disposing an adhesive material 18 on the light-emitting surface 111 of the light-emitting chip 11, as shown in FIG. 11.

Figure 12:
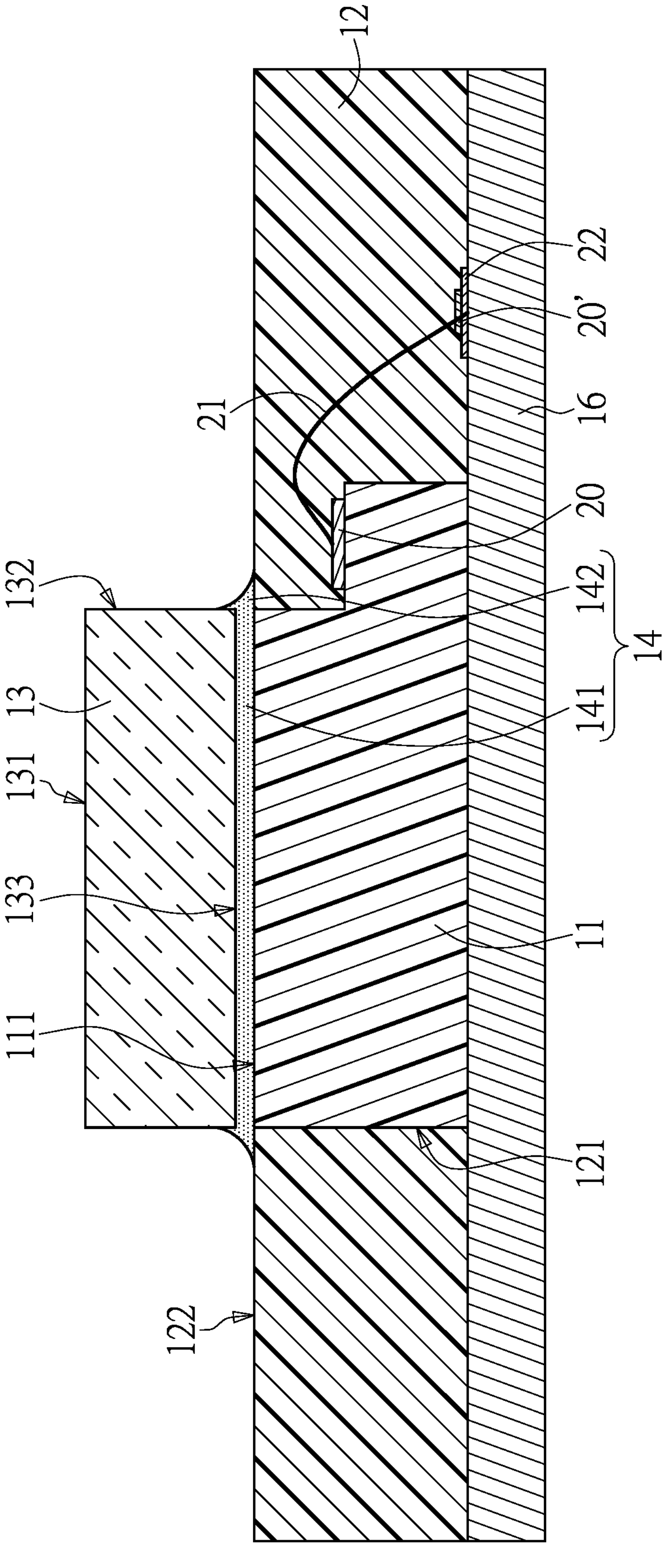
Figure 13:
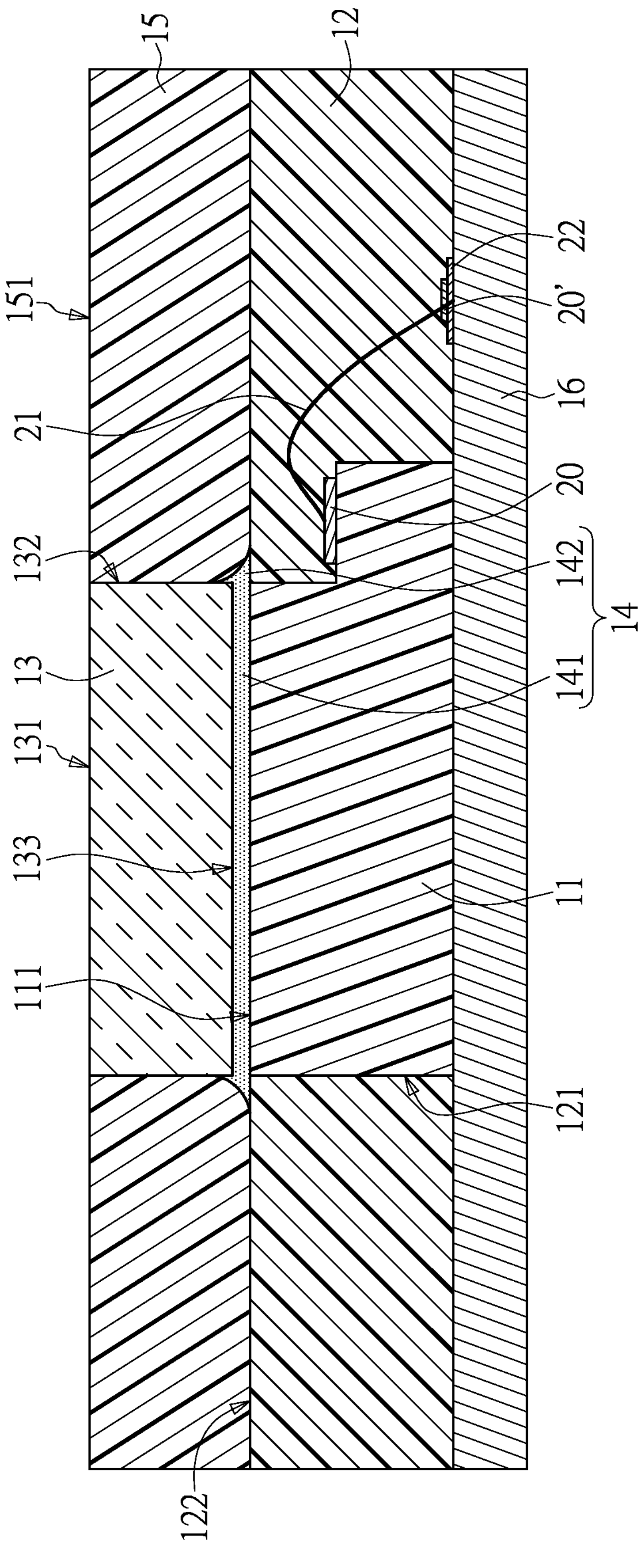

Step S4 includes: disposing a light-permeable layer 13 on the adhesive material 18, and applying a pressure to the light-permeable layer 13 such that the adhesive material expands along four directions to form an adhesive element 14. The adhesive element 14 has a central portion 141 on the light-emitting surface 111, and forms four extension portions 142 on the first upper surface 122 of the first reflective layer 12 and a part of the second side surface 132 of the light-permeable layer 13, as shown in FIG. 3 and FIG. 12.

Step S5 includes: disposing a second reflective layer 15 on the first reflective layer 12. The second reflective layer 15 surrounds the second side surface 132 of the light-permeable layer 13 and covers the extension portion 142. The light-exiting surface 131 is exposed on a second upper surface 151 of the second reflective layer 15, as shown in FIG. 8. After the steps S1 to S5 are performed, the manufacturing of the light-emitting device is completed. In some embodiments, the top of the second reflective layer 15 can optionally be ground or polished for the light-exiting surface 131 of the light-permeable layer 13 to be exposed on the second upper surface 151 of the second reflective layer 15, and the light-exiting surface 131 is further flush with the second upper surface 151. In other words, when the second reflective layer 15 is formed by molding, part of the side surface 134 of the light-permeable layer 13 is covered by the adhesive element 14, so the light-permeable layer 13 and the adhesive element 14 has no gap therebetween for the second reflective layer 15 to penetrate into.

Specifically, different from the general glue dispensing process, the glue amount of the adhesive material in step S3 in the present disclosure is deliberately adjusted to match with the pressure in step S4 to ensure that after the adhesive material 14 is squeezed, an extension portion 142 is formed and located on the first upper surface 122. For example, when disposing the adhesive material 18 in step S3, the position of the adhesive material 18 is deviated from the center of the light-emitting surface 111 of the light-emitting chip 11. According to the amount of glue of the adhesive material 18 and the force applied to the light-permeable layer 13, the adhesive material 18 can extend in only one direction or certain directions when squeezed. In other words, the expansion direction, length, thickness and number of the extension portion 142 can be determined by applying a certain pressure to the light-permeable layer 13, such that the adhesive material 18 expands to form the adhesive element 14. The adhesive element 14 has a central portion 141 located on the light-emitting surface 111, and one or more extension portions 142 located on the first upper surface 122 of the first reflective layer 12.

The embodiment as shown in FIG. 8 further includes step S1' of: providing a circuit board 16 and the light-emitting chip 11 is located on the circuit board 16. The light-emitting chip 11 is in electrical connection with the circuit board 16. For example, the light-emitting chip 11 is electrically connected to the circuit board 16 through the conductive layer 22, the solder pads 20 and 20', and the wire 21 (as shown in FIG. 7). In addition, in this embodiment, step S6 is further performed after performing step S5. Step S6 includes: disposing a protective film 17 to cover the first reflective layer 12, the second reflective layer 15, and the light-permeable layer 13, as shown in FIG. 7. However, the present disclosure does not limit whether or not the light-emitting chip 11 is in electrical connection with the circuit board 16. According to certain embodiments, a circuit board 16 is not provided, and external electrode pins 30 (e.g., a fan-out package) are disposed on the bottom of the light-emitting chip 11. Accordingly, after step S5 or step S6 are performed, the manufacturing of the light-emitting device as shown in FIG. 2 is completed.

Beneficial Effects of the Embodiments

Reference is further made to FIG. 2 and FIG. 7. According to these embodiments, one of the beneficial effects of the present disclosure is that the light-emitting device provided by the present disclosure has the technical features of "forming the first reflective layer and the extension portion extends to part of the side surface of the light-permeable layer", such that when the second reflective layer is molded, the glue is prevented from penetrating into the gap between the light-emitting chip and the light-permeable layer, thereby improving the luminous effect of the light-emitting device. According to certain embodiments, the luminance of the light-emitting device is increased by about 18%.

The present disclosure further provides a manufacturing method of a light-emitting device, and the manufacturing method can also produce the light-emitting device having the abovementioned advantages.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting device, comprising:

a light-emitting chip having a light-emitting surface;

a first reflective layer surrounding a first side surface of the light-emitting chip;

a light-permeable layer disposed on the light-emitting surface of the light-emitting chip, wherein the light-permeable layer has a light-permeable surface and a second side surface;

an adhesive element disposed between the light-emitting chip and the light-permeable layer, wherein the adhesive element has a central portion and at least one extension portion, and the central portion corresponds to the light-emitting surface; wherein the at least one extension portion is connected to the central portion and located on a first upper surface of the first reflective layer, and the at least one extension portion extends to a part of the second side surface; and a second reflective layer disposed on the first reflective layer, wherein the second reflective layer surrounds the second side surface and covers the at least one extension portion, the light-permeable surface is exposed on a second upper surface of the second reflective layer, and the light-exiting surface is flush with the second upper surface.

2. The light-emitting device according to claim 1, further includes a circuit board, wherein the light-emitting chip is disposed on the circuit board and is in electrical connection with the circuit board.

3. The light-emitting device according to claim 1, wherein the light-permeable layer has a wavelength converting substance.

4. The light-emitting device according to claim 1, wherein an adhering surface is defined on a surface of the light-permeable layer facing the light-emitting surface; wherein an area of the adhering surface is greater than, equal to, or smaller than an area of the light-emitting surface.

5. The light-emitting device according to claim 1, wherein a quantity of the extension portions is four.

6. The light-emitting device according to claim 1, wherein a range of a thickness of the light-permeable layer is from 100 μm to 300 μm.

7. The light-emitting device according to claim 1, wherein a range of a refractive index of the light-permeable layer is from 1.0 to 2.0.

8. The light-emitting device according to claim 1, further includes a protective film covering the first reflective layer, the second reflective layer, and the light-permeable layer.

9. The light-emitting device according to claim 8, wherein a range of a thickness of the protective film is from 10 μm to 100 μm.

* * * * *